United States Patent
Kamiya et al.

(10) Patent No.: US 7,293,889 B2
(45) Date of Patent: Nov. 13, 2007

(54) LED LAMP APPARATUS

(75) Inventors: Takayuki Kamiya, Nishikasugai-gun (JP); Hideki Kokubu, Nishikasugai-gun (JP); Hiroshi Ito, Nishikasugai-gun (JP); Kazushi Noda, Nishikasugai-gun (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 0 days.

(21) Appl. No.: 11/012,720

(22) Filed: Dec. 16, 2004

(65) Prior Publication Data

US 2005/0152127 A1    Jul. 14, 2005

(30) Foreign Application Priority Data

Dec. 19, 2003    (JP)    ............................ 2003-422820

(51) Int. Cl.
 *F21V 9/16*    (2006.01)
(52) U.S. Cl. .................... 362/84; 362/311; 362/355; 362/361
(58) Field of Classification Search ............... 362/84, 362/311, 326, 332, 355, 360, 361; 359/599, 359/707; 349/64; 313/512; 257/98
See application file for complete search history.

(56) References Cited

U.S. PATENT DOCUMENTS

| | | | | |
|---|---|---|---|---|
| 3,821,590 A | * | 6/1974 | Kosman et al. ............. | 313/499 |
| 4,164,012 A | * | 8/1979 | Gulliksen ................... | 362/282 |
| 4,599,537 A | * | 7/1986 | Yamashita .................. | 313/501 |
| 5,066,889 A | * | 11/1991 | Edwards ..................... | 313/512 |
| 5,820,246 A | * | 10/1998 | Helstern ...................... | 362/84 |
| 6,109,771 A | * | 8/2000 | Konagaya .................... | 362/497 |
| 6,275,338 B1 | * | 8/2001 | Arai et al. .................. | 359/599 |
| 6,328,456 B1 | * | 12/2001 | Mize .......................... | 362/311 |
| 6,350,041 B1 | * | 2/2002 | Tarsa et al. ................. | 362/355 |
| 6,592,238 B2 | * | 7/2003 | Cleaver et al. ............. | 362/249 |
| 6,614,172 B2 | * | 9/2003 | Chiu et al. .................. | 313/501 |
| 6,787,999 B2 | * | 9/2004 | Stimac et al. ................ | 315/51 |
| 6,932,496 B2 | * | 8/2005 | Rizkin et al. ............... | 362/299 |
| 2002/0149943 A1 | * | 10/2002 | Obata .......................... | 349/64 |
| 2003/0016521 A1 | * | 1/2003 | Wang et al. .................. | 362/31 |
| 2003/0151361 A1 | * | 8/2003 | Ishizaka ...................... | 313/512 |
| 2004/0120155 A1 | * | 6/2004 | Suenaga ...................... | 362/362 |

FOREIGN PATENT DOCUMENTS

| | | |
|---|---|---|
| JP | A-08-339704 | 12/1996 |
| JP | A-2001-189103 | 7/2001 |

* cited by examiner

*Primary Examiner*—Alan Cariaso
(74) *Attorney, Agent, or Firm*—Posz Law Group, PLC

(57) ABSTRACT

An LED lamp apparatus includes an LED and a light diffuser located on a light emission side of the LED. The light diffuser is made of at least one light transmittable material and has a light diffusing member at a peripheral portion of a light passing area of the LED. Alternatively, the light diffuser may be formed of at least one light transmittable material, and the light diffusing member may be located at a center portion of the light passing area of the LED.

11 Claims, 4 Drawing Sheets

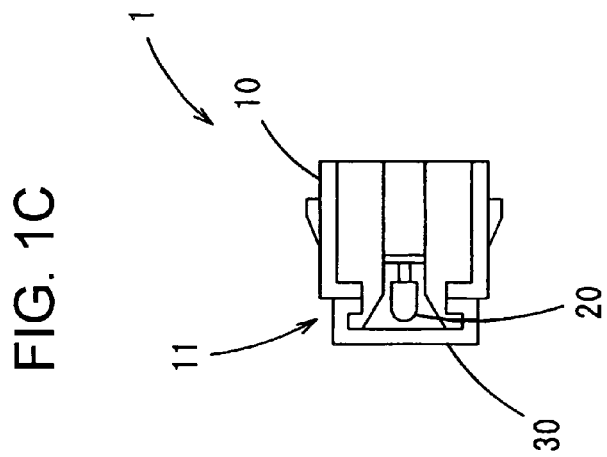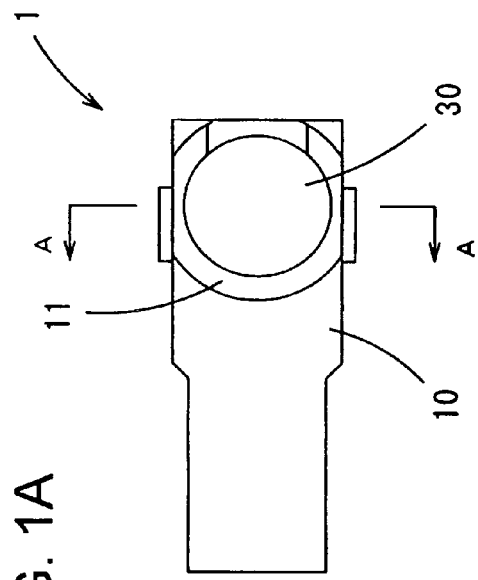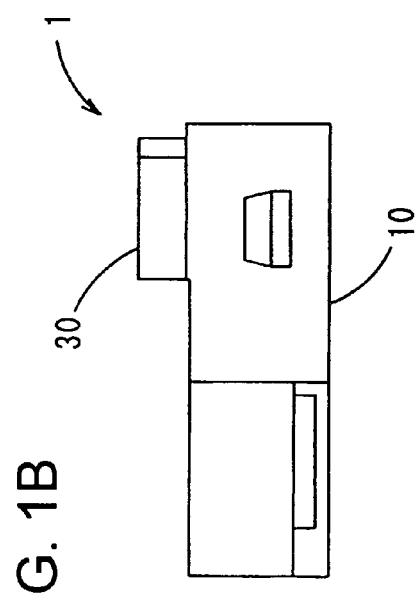

US 7,293,889 B2

LED LAMP APPARATUS

CROSS REFERENCE TO RELATED APPLICATION

The present application is related to and incorporates by reference Japanese Patent Application No. 2003-422820, which was filed on Dec. 19, 2003.

BACKGROUND OF THE INVENTION

The present invention relates generally to light emitting diodes (LEDs), and specifically to an LED lamp apparatus that includes an LED as a light source for use in spot lighting illuminations in environments such as in the interior of a motor vehicle.

LED lamps are becoming a more popular choice than conventional bulb lamps for use in many conventional illumination applications. This is because an LED lamp is suitable for use as a light source in spot light illumination because of its characteristic of being highly directional. This directional characteristic of the LED lamp is primarily controlled by a lens and/or a cover that changes a portion of the LED illumination.

The directional characteristic of an LED lamp is suitable for obtaining a narrow illumination area. However, because the directional characteristic creates a distinct boundary between the illuminated area and the peripheral area (non-illuminated area), the LED lamp is not preferable for all applications. For example, for the purpose of both improving visibility and creating a relaxing atmosphere (or luxury atmosphere) in the vehicle interior, it is preferable to use an illumination pattern in which the peripheral area of the illumination area is gradated.

On the other hand, an LED lamp can be designed to emit light having a color that differs from the original color of the light emitted from the LED. This can be accomplished through the use of fluorescent particles, which are excited by light emitted from the LED, in the LED lens or in another location in proximity to the lens. In one version of this type of LED lamp, a white LED lamp may include a blue LED and a lens with yellow or greenish yellow fluorescent particles. By mixing the blue light emitted by the LED and the yellow or greenish yellow light output through the fluorescent particles, the white LED lamp can emit a white light. However, because of the difference of the emitting points between the blue light (the position of the LED) and the yellow or greenish yellow light (the position of the fluorescent materials), mixing the colors of these two sources thoroughly over the entire area being illuminated is difficult. As a result, yellowish light is observed around the peripheral area of the illuminated area, thereby resulting in non-uniform color illumination.

Other LED lamps have been designed to exhibit uniform color illumination. However, such LED lamps typically exhibit non-uniform degrees of brightness.

SUMMARY OF THE INVENTION

The present invention overcomes the above-mentioned limitations by providing an LED lamp apparatus that includes an LED for emitting light and a light diffusing member located on a light emitting side of the LED. The light diffusing member is made of at least one light transmittable material and has a light diffusing finish at a peripheral portion of a light passing area of the LED.

The present invention also provides another type of LED lamp apparatus that includes an LED for emitting light and a light diffusing member located on a light emitting side of the LED. The light diffusing member is made of at least one light transmittable material and has a light diffusing finish at the center portion of a light passing area of the LED.

BRIEF DESCRIPTION OF THE DRAWINGS

The accompanying figures, in which like reference numerals refer to identical or functionally similar elements throughout the separate views and which, together with the detailed description below, are incorporated in and form part of the specification, serve to further illustrate various embodiments and to explain various principles and advantages all in accordance with the present invention.

FIG. 1A is a top view showing an LED lamp apparatus according to one embodiment of the present invention; FIG. 1B is side view showing the same; and FIG. 1C is cross section view through line A-A in FIG. 1A.

DETAILED DESCRIPTION OF THE PREFERRED EMBODIMENTS

Figure 2A:
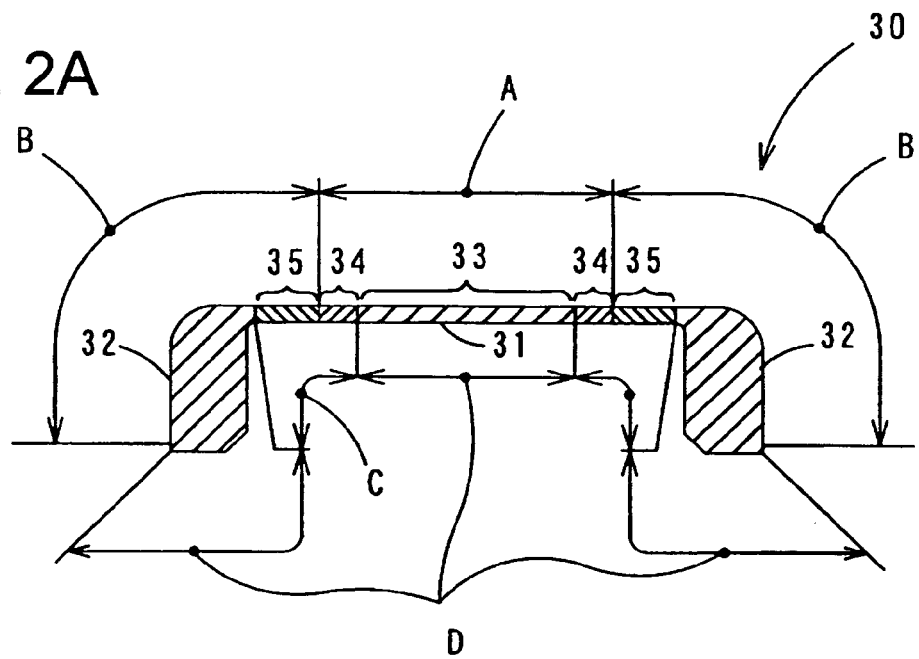
FIG. 2A is a longitudinal sectional view showing a cap used with the LED lamp apparatus shown in FIGS. 1A-1C.

Referring now to the drawings in which like reference numbers reference like parts, a light emitting diode (LED) lamp apparatus will be described. Although the present invention will be discussed within the context of vehicle interior illumination, it should be appreciated by one skilled in the art that the LED lamp apparatus and method of manufacture is applicable for use in other vehicle locations as well as other like or equivalent applications.

Referring now to FIGS. 1A, 1B and 1C, an LED lamp apparatus 1 according to a first embodiment includes a housing 10, an LED lamp 20 and a cap 30. The housing 10 is preferably made of an injection molded black plastic material and has a cylindrical protrusion 11 at one end. At the end of the cylindrical protrusion 11, an inside diameter of the cylindrical protrusion 11 gradually increases toward the external direction.

As shown in FIG. 1C, the LED lamp 20 is disposed in the cylindrical protrusion 11 of the housing 10. The LED lamp 20 is a lens type LED that emits an amber colored light. The cap 30 covers the opening of the housing 10 at the end of the cylindrical protrusion 11.

Figure 2B:
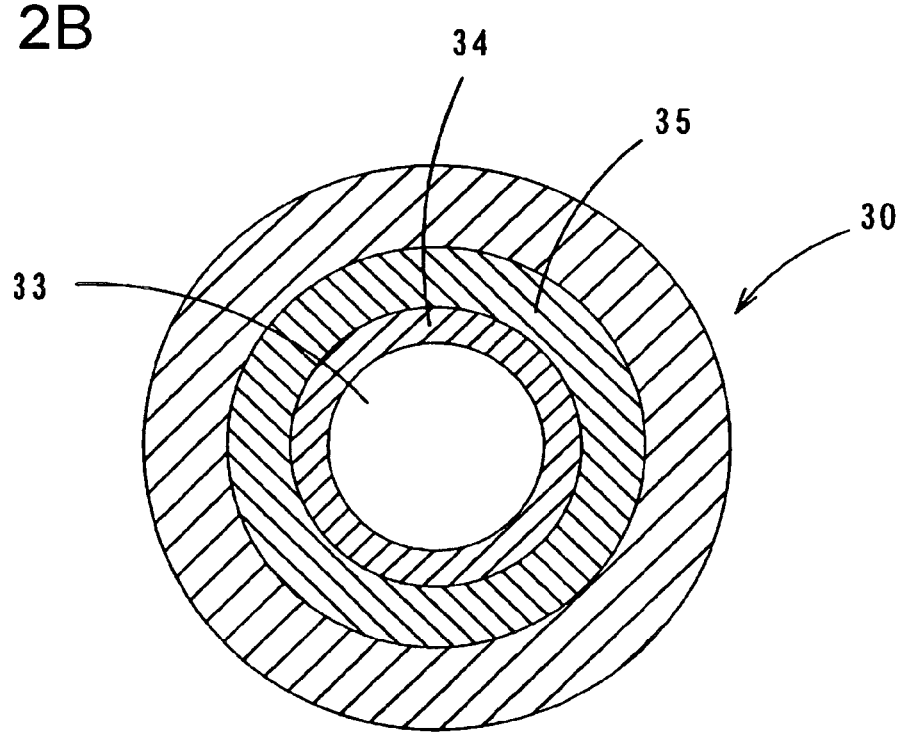
FIG. 2B is a top view showing the same.

Referring now to FIGS. 2A and 2B, the cap 30 will be described. The cap 30 is preferably made of silicon rubber and is U-shaped with an opening on a side that faces the LED lamp 20. However, the actual shape and diameter of the cap 30 may vary, as the cap 30 is designed to conform to the shape of the cylindrical protrusion 11 of the housing 10.

As shown in FIG. 2A, the cap 30 includes a circularly shaped upper wall portion 31 and a side wall portion 32 that is formed continuously around the periphery of the upper wall portion 31. The cap 30 has a blast finishing on both sides of the upper wall portion 31. Specifically, the upper wall portion 31 of the cap 30 is divided into plural areas, with each area being blast finished under the following conditions.

AREA A: blast finishing A (blast degree; #100)
AREA B: blast finishing B (blast degree; #50)
AREA C: blast finishing C (blast degree; #80)
AREA D: mirror finishing In the above mentioned LED lamp apparatus 1 including the cap 30, light emitted from the LED lamp 20 is directed toward the cap 30 through the opening of the cylindrical protrusion 11. The cylindrical protrusion 11 cuts some of the light emitted from the LED lamp 20 in accordance with the shape of the opening of the cylindrical protrusion 11, and the light enters into the cap 30. The light is then diffused by a light diffusing member formed by the above discussed blast finishing of the cap 30 and depending upon the portion of the light diffusing member 30 through which the light is emitted, and more specifically on the degree of blast finishing of that portion of the cap 30 through which the light is diffused. As shown in FIGS. 2A and 2B, the light diffusing member includes a center portion 33 of the cap 30, a first peripheral portion 34 of the cap 30 and a second peripheral portion 35 of the cap 30. Light is diffused by the light diffusing member (the center portion 33, the first peripheral portion 34, the second peripheral portion 35) so that the degree of the brightness is diffused through the above portions of the cap 30 satisfy the following relationship: center light>first peripheral light>second peripheral light.

The overall illumination of the LED lamp apparatus 1 is realized by a combination of the diffused light through the center portion 33, the first peripheral portion 34 and the second peripheral portions 35 of the cap 30. The peripheral area of illumination is primarily formed by light diffused through the first peripheral portion 34 and the second peripheral portion 35 of the cap 30. The light through the first and second peripheral portions 34, 35 of the cap 30 is highly diffused. Therefore, the boundary between the illuminated area and the non-illuminated area (the external periphery of the illumination area) is not well defined. More specifically, the LED lamp apparatus 1 dimly illuminates the peripheral boundary between the illuminated area and the non-illuminated area. On the other hand, because the light emitted through the first and second peripheral portions 34, 35 of the cap 30 is highly diffused, this diffused light, when added to the light passing through the center portion 33 of the cap 30, results in a center portion of the area of illumination that has a high degree of brightness, or luminous intensity.

As discussed above, the peripheral area of illumination of the LED lamp apparatus 1 is primarily defined by the light diffused through the first and second peripheral portions 34, 35 of the cap 30. The degree of the brightness diffused through the second peripheral portion 35 is lower than that of the light diffused through the first peripheral portion 34. Because of the difference in the respective degree of the brightness, the illumination area of the LED lamp apparatus 1 gradually increases in the degree of the brightness from a peripheral area thereof toward the center area thereof. This gradual increase in the degree of the brightness prevents a defined illumination area from occurring at the boundary between the illuminated area and the non-illuminated area.

In the present embodiment, the center portion 33 of the cap 30 is blast finished. Therefore, the light emitted through the center portion 33 of the cap 30 is also diffused, thereby equalizing the center area of illumination with the peripheral illumination areas illuminated by light that is diffused by the first and second peripheral portions 34, 35 of the cap 30.

Each element of the present invention will now be described in detail. In the present invention, the LED lamp 20 is used as a light source. The LED lamp 20 preferably includes a light emitting element packed in a resin material, such as a lens type LED or an SMD type (Surface Mounted Device) LED. The light emitting element has a specific color that is dependent upon by the materials used to form the element, and the color of the LED lamp 20 can be mixed. Therefore, more than one light emitting element, each of which emits a different color, can be combined in the same LED package in order to obtain the mixed color. For example, a white color LED may be obtained by mixing the light of red, green and blue light emitting elements set in the same package.

The white color of a white LED lamp 20 may be obtained by mixing the colors of the light emitting element, or by mixing fluorescent light resulting from the excitation of fluorescent particles by light emitted from the light emitting element. Therefore, a white LED lamp 20 may be formed, for example, by an LED lamp provided with a blue LED and a yellow or greenish-yellow fluorescent light resulting from the fluorescent material being excited by light emitted by the blue LED. The fluorescent material can be applied not only internally within the LED lamp apparatus 1, but also in a light diffusing member 30 such as the cap 30 in this embodiment, on a surface of the light diffusing member 30 and/or in a color changing layer disposed between the LED and the light diffusing member 30.

The fluorescent particles may be of any type, such as, for example, organic or inorganic fluorescent particles. The organic fluorescent particles can emit a clear luminescence. On the other hand, the inorganic fluorescent particles can emit a matted luminescence. Various kinds of fluorescent particles can be applied, such as particles capable of producing fluorescent light of three primary colors; red, green, blue, and any other additive colors emitted from fluorescent particles. A plurality of the fluorescent particles can be mixed to produce a fluorescent light of a particular color, such as when red, green and blue fluorescent particles are mixed to result in white fluorescent light.

A light diffusing member 30 is arranged on a light emitting side of the LED lamp 20. In order to receive substantially all of the light from the LED lamp 20, the light diffusing member 30 must be of sufficient size to be arranged over the light emitting side of the LED lamp 20. The light diffusing member 30 provides a light introducing surface that receives light from the LED lamp 20 and a light emitting surface that outwardly emits the introduced light. Typically, a planar light diffusing member is used, and the light introducing surface and the light emitting surface are provided on two or more of the planar surfaces of the planar light diffusing member.

The light diffusing member 30 is made of a translucent material that is translucent relative to the LED light. However, this translucence does not mean that the light diffusing member must emit light with no associated loss. In other words, a translucent material that absorbs or blocks a part of the LED light may be used for the light diffusing member. Specifically, a light diffusing member that can emit more than 60%, and preferably more than 70%, and further preferably more than 80% of light introduced thereto, is preferably used. Preferably, the light diffusing member is made from a material such as silicon rubber, silicon resin, acrylic resin, polyethylene terephthalate (PET), polycarbonate resin, epoxy resin, glass, or other like materials capable of exhibiting the above operating parameters.

The light diffusing member includes a light diffusing finish on at least one part of a light passing area. A non-diffusing part, which does not include the light diffusing finish, of the light diffusing member can be thinner than a diffusing part of the light diffusing member. The non-diffusing part can be a through hole (opening). In this case, because the light passing through the non-diffusing part can emit outwardly without a loss of brightness, the resulting illumination area has a higher associated degree of brightness.

The thickness of the light passing area of the light diffusing member may also be graduated. For example, in the case that the center of the light passing area includes the non-diffusing part, the thickness of the light diffusing member is increased at a regular ratio from the center to the periphery. In this case, light passing through the light diffusing member is absorbed well at the periphery of the light diffusing member. As a result, the light passing through the light diffusing member has an associated area of illumination with a center that is brighter than the periphery, and a boundary between the area of illumination and a non-illuminated area that becomes non-distinct, or in other words less defined. In addition, the rate of thickness of the light diffusing member is not always constant.

The light diffusing finish may be formed on either the light introducing surface or the light emitting surface of the light diffusing member. Alternatively, the light diffusing finish can be applied to both the light introducing surface and the light emitting surface. Although the light diffusing finish is not specifically limited to a particular type of finish, it can be formed by, for example, blast finishing (forming a plurality of minute convexo concaves), printing or painting an ink including a light diffusing agent, or adhering a light diffusing film or sticker on the light diffusing member. A mold having a blast finish in a predetermined area can be used to form the light diffusing member including the light diffusing finish. Hereinafter, such methods for forming the light diffusing finish will be referred to generally as forming a light diffusing finish by blast finishing.

In the case of making the light diffusing finish by a surface treating process, the light diffusing level can be controlled by changing the particle size of the abrasive or the processing time. On the other hand, in the case of the light diffusing finish by painting ink including a light diffusing agent, the light diffusing level can be controlled by changing the kind, the particle size, and the concentration of the light diffusing agent.

In the present invention, the applicable light diffusing finish is not limited to treating the surface of the light diffusing member. A light diffusing agent, such as an agent formed from titanium or silica particles, can be added into the predetermined area of the light diffusing member in order to diffuse the light from the LED lamp 20.

By adding coloring matter or fluorescent particles into the light diffusing member, the light diffusing member can cause a color conversion of the light emitted from the LED lamp 20. A pigment or a dye can be utilized as the coloring matter. Both organic and/or inorganic fluorescent particles can be added into the light diffusing member. Many kinds of color conversion material that are capable of converting the color of the LED light can also be applied to the light diffusing member. A light diffusing member that contains different kinds of color converging materials can be utilized with the LED lamp apparatus 1. Thus, adequate color of illumination for any purpose can be obtained.

The light diffusing member may encapsulate the LED lamp 20. In other words, the LED lamp 20 may be disposed in the light diffusing member. In concrete terms, a resin seal can be used as the light diffusing member. For example, a lens (the resin seal member) of a lens-type LED lamp apparatus may be used as the light diffusing member when the lens includes a light diffusing finish. In such a case, because an additional diffusing member is not needed, the LED lamp apparatus is simplified and the size of the LED lamp apparatus can also be reduced.

Figure 3A:
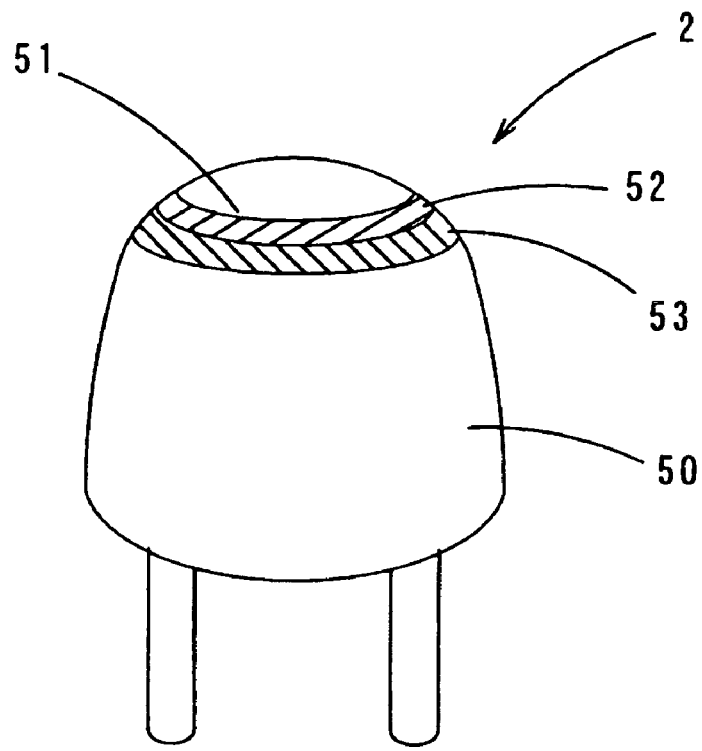
FIG. 3A is a perspective view showing an LED lamp according to another embodiment of the present invention.
Figure 3B:
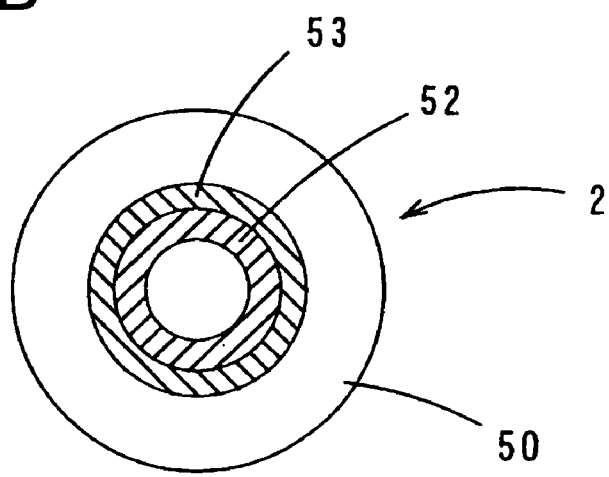
FIG. 3B is a top view showing the same.

FIGS. 3A and 3B show an LED lamp apparatus 2 of another embodiment of the present invention. The LED lamp apparatus 2 includes a white LED that emits white light that is formed by mixing blue light from a blue LED and fluorescent light emitted from a fluorescent material (yellow or greenish-yellow) that is excited by light from the blue LED. As shown in FIG. 3A, the peripheral surface area portion of a lens 50, through which light from the LED or the fluorescent material passes, includes a surface formed by blast finishing. The condition of the blast finishing differs based on the distance of the particular portion of the surface from the top of the lens 50. For example, a first peripheral portion 52 is nearer to the top of the lens 50 than a second peripheral portion 53. To be more precise, the blast finishing C of the above mentioned embodiment is applied to the first peripheral portion 52, and the blast finishing B is applied to the second peripheral portion 53.

Still referring to FIGS. 3A-3B, the peripheral area of illumination is primarily formed by light that is emitted through the first and second peripheral portions 52, 53, which form the light diffusing member of second embodiment, of the lens 50. The light that is emitted through the first and second peripheral portions 52, 53 of the lens 50 is diffused by the blast finished surface of the lens 50 when the light emits toward the outside of the LED lamp apparatus 2. Therefore, the peripheral area of illumination of the LED lamp apparatus 2 is formed by the highly diffused light. As a result, the peripheral area of illumination becomes less visible relative to the center area of illumination. Thus, the LED lamp apparatus 2 provides a blurred area of illumination at the peripheral area (the boundary between the illumination area and the non-illumination area). By the above mentioned diffusion effect, the mixing of the light from the LED and the fluorescent light is effected at the peripheral area of illumination. As a result, the color of the peripheral area of illumination is mixed well.

On the other hand, because light through the peripheral portion of the lens 50 is strongly diffused, some of the diffused light is added to the light that passes through the center portion of the lens 50. As a result, the brightness of the center area of illumination is increased.

As in the first embodiment, the peripheral area of illumination formed by the LED lamp apparatus 2 is primarily formed with the light diffused through the peripheral portions 52, 53 of the lens 50. The degree of the brightness diffused at the first peripheral portion 52 is stronger than that of the light diffused at the second peripheral portion 53 because the light at the second peripheral portion 53 is strongly diffused. Because of the difference in diffusion, the area of illumination of the LED lamp apparatus 2 gradually brightens from the center area toward the peripheral area, and thereby eliminates formation of a well-defined boundary between the illumination area and the non-illumination area.

Figure 4:
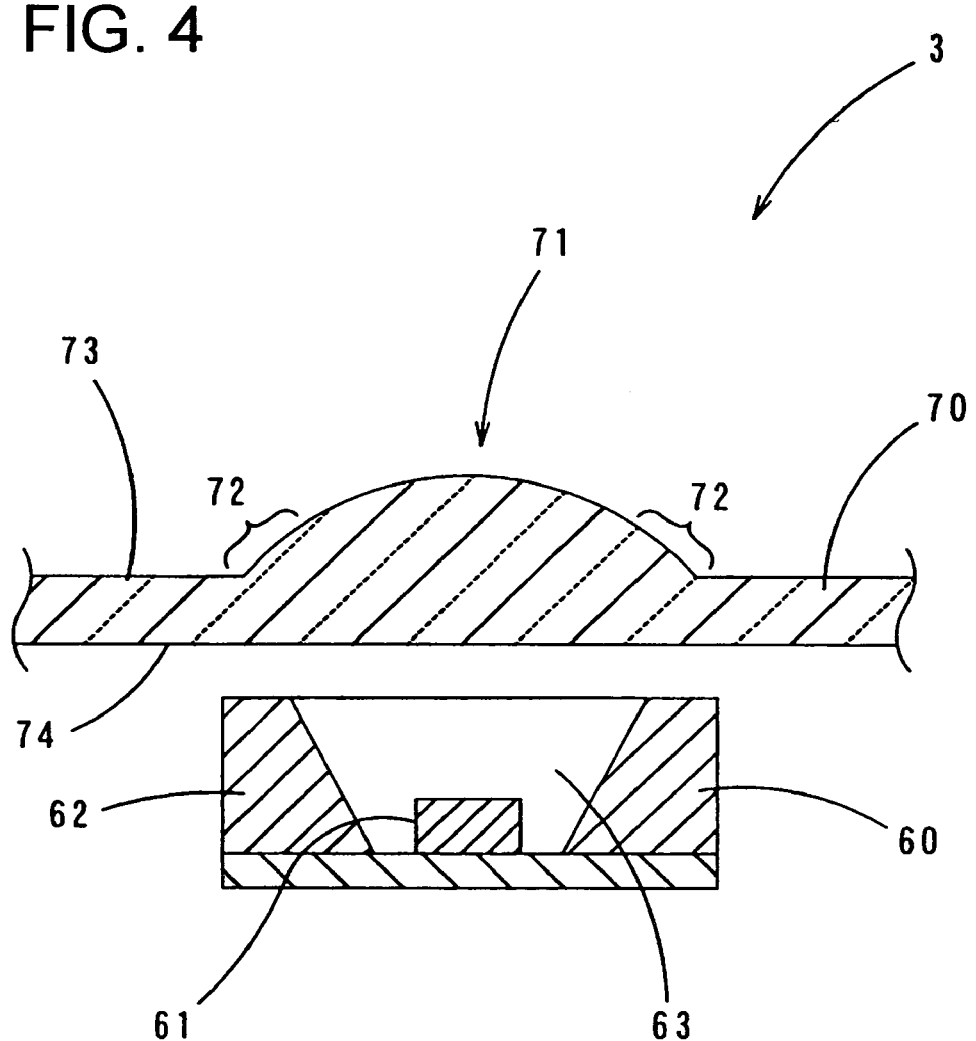
FIG. 4 is a cross section view of an LED lamp, apparatus according to yet another embodiment of the present invention.

FIG. 4 shows a third embodiment of the present invention. This embodiment is an LED lamp apparatus 3 that combines an SMD type LED 60 and a lens 70. The lens 70 covers the light emitting side of the LED 60. The LED 60 includes a blue LED 61 surrounded by a bowl-shaped reflector 62. A seal resin material 63 containing fluorescent particles that emit a yellow or greenish-yellow color fluorescence fills a space defined by the reflector 62 and therefore encapsulates the LED 60. The LED 60 emits a white light as a result of the mixture of the light emitted by the blue LED 61 and the greenish-yellow light emitted by the fluorescent particles when the particles are excited by the light emitted from the blue LED 61.

The lens 70 is preferably made of acrylic resin and includes a converging lens portion 71 at an area through which the light of the LED 60 passes. A peripheral surface 72 of the converging lens portion 71 includes a blast finishing. To be more precise, the blast finishing C of the above mentioned embodiment is applied to the peripheral surface 72. Therefore, the light diffusing member of the third embodiment is formed by the peripheral surface 72 (Although one skilled in the art will appreciate that fluorescent material 63 is also the light diffusing member).

As the above mentioned structure of the LED lamp apparatus 3, light from the LED 60 emits outwardly through the converging lens portion 71 and is focused when it is converged by the converging lens portion 71. The peripheral area of the illumination mainly includes light that passes through the peripheral surface 72 of the converging lens portion 71. Therefore, the peripheral area of illumination of the LED lamp apparatus 3 includes the highly diffused light. As a result, the peripheral area of illumination of the LED lamp apparatus 3 is less bright relative to the central area of illumination.

Thus, the LED lamp apparatus 3 provides the blurred illumination at the boundary between the illumination area and the non-illumination area. By the above mentioned diffusion effect, the light from the LED 60 and the fluorescent light is mixed at the peripheral area of illumination. As a result, the color of the peripheral area of the illumination is mixed well.

On the other hand, because the light emitted through the peripheral portion 72 of the lens 70 is highly diffused, a portion of the diffused light is added to the light that passes through the converging lens portion 71 toward the outside. As a result, the brightness of the center area of the illumination is strengthened.

The peripheral portion 72 of the converging lens portion 71 of the LED lamp apparatus 3 is blast finished in an even manner. As in the above mentioned first and second embodiments, as the peripheral portion 72 is divided based on the distance from the top of the converging lens 71, the intensity of the blast finishing may gradually increase from the area that is closest to the top of the converging lens portion 71 toward the area that is farthest from the top of the converging lens portion 71. In this construction, there is no well-defined change in the brilliance at the boundary between the light emitted through the center of the converging lens portion 71 (primarily the center of the illumination area) and light emitted through the peripheral portion 72 of the converging lens portion 71 (primarily the periphery of the illumination area). Thus, the boundary between the two types of emitted light is not visible.

Furthermore, instead of blast finishing the outer surface of the lens 70 (light emitting surface), the inner surface of the lens 70 (light introducing surface) may also be blast finished. In order to diffuse the light passing through the center of the converging lens portion 71, the outer and/or inner surface of the converging lens portion 71 may be blast finished. Moreover, blast finishing is also applicable at lens locations other than the converging lens portion 71.

The disclosure is intended to explain how to fashion and use various embodiments in accordance with the invention rather than to limit the true, intended and fair scope and spirit thereof. The foregoing description is not intended to be exhaustive or to limit the invention to the precise form disclosed. Modifications or variations are possible in light of the above teachings. The embodiments were chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application, and all equivalents thereof, when interpreted in accordance with the breadth to which they are fairly, legally, and equitably entitled.

The invention claimed is:

1. A light emitting diode (LED) lamp apparatus, comprising:
    an LED;
    a light diffusing cap formed from a light transmitting material and positioned at a emission side of the LED, the light diffusing cap being generally cup-shaped and having
    a circular center portion,
    an first annular peripheral portion, wherein the first annular peripheral portion has a light diffusing finish such that light that passes through the first annular peripheral portion is diffused to a higher degree than light that passes through the center portion, and the light diffusing finish is uniform throughout the first annular peripheral portion, and
    a second annular peripheral portion, wherein the second annular peripheral portion has a light diffusing finish has a light diffusing finish such that light that passes through the second annular peripheral portion is diffused to a higher degree than light that passes through the first annular peripheral portion, and the light diffusing finish is uniform throughout the second annular peripheral portion,
    wherein the brightness of light emanating from the light diffusing cap increases in a direction from any location at an outer edge of the peripheral portion of the light diffusing cap toward the center of the cap.

2. A light emitting diode (LED) lamp apparatus according to claim 1, wherein the circular center portion, the first annular peripheral portion and the second annular peripheral portion are parts of a planar member that has a uniform thickness.

3. The LED lamp apparatus according to claim 1, wherein the light diffusing finish comprises blast finish formed by a plurality of minute concavities formed on one surface of the cap.

4. The LED lamp apparatus according to claim 1, wherein the cap includes an annular side wall that is angled with respect to the center portion.

5. The LED lamp apparatus according to claim 1, wherein an inner surface of the cap, which faces the LED, includes a blast finish for diffusing light.

6. The LED lamp apparatus according to claim 1, wherein the light diffusing cap includes a color changing material for changing a color of light that passes through the cap.

7. The LED lamp apparatus according to claim 1, wherein the cap encapsulates the LED.

8. The LED lamp apparatus according to claim 1, wherein a luminescent material is located at a position through which the light emitted from the LED passes.

9. The LED lamp apparatus according to claim 8, wherein the LED emits a blue light and the luminescent material emits yellow or greenish yellow color fluorescence when the luminescent material is excited by the light emitted from the LED.

10. The LED lamp apparatus according to claim 8, wherein the LED emits an ultraviolet light and the luminescent material is excited by the ultraviolet light.

11. The LED lamp apparatus according to claim 1, wherein the cap is fitted on a cylindrical protrusion that blocks some of the light emitted from the LED.

* * * * *